(12) United States Patent
Boettiger et al.

(10) Patent No.: US 7,476,562 B2
(45) Date of Patent: Jan. 13, 2009

(54) GAPLESS MICROLENS ARRAY AND METHOD OF FABRICATION

(75) Inventors: Ulrich C. Boettiger, Boise, ID (US); Jin Li, Boise, ID (US)

(73) Assignee: Aptina Imaging Corporation, Grand Cayman (KY)

(*) Notice: Subject to any disclaimer, the term of this patent is extended or adjusted under 35 U.S.C. 154(b) by 498 days.

(21) Appl. No.: 11/209,758

(22) Filed: Aug. 24, 2005

(65) Prior Publication Data

US 2005/0280012 A1  Dec. 22, 2005

Related U.S. Application Data

(63) Continuation-in-part of application No. 11/002,231, filed on Dec. 3, 2004, now Pat. No. 7,307,788, and a continuation-in-part of application No. 10/681,308, filed on Oct. 9, 2003, now Pat. No. 7,227,692.

(51) Int. Cl.
*H01L 21/00* (2006.01)
(52) U.S. Cl. .......................... 438/57; 438/60
(58) Field of Classification Search ............ 438/57, 438/60
See application file for complete search history.

(56) References Cited

U.S. PATENT DOCUMENTS

| | | | |
|---|---|---|---|
| 5,074,649 A | 12/1991 | Hamanaka |
| 5,238,856 A | 8/1993 | Tokumitsu |
| 5,466,926 A | 11/1995 | Sasano et al. |
| 5,536,455 A | 7/1996 | Aoyama et al. |
| 5,955,753 A | 9/1999 | Takahashi |
| 6,140,630 A | 10/2000 | Rhodes |
| 6,204,524 B1 | 3/2001 | Rhodes |
| 6,310,366 B1 | 10/2001 | Rhodes et al. |
| 6,326,652 B1 | 12/2001 | Rhodes |
| 6,333,205 B1 | 12/2001 | Rhodes |
| 6,376,868 B1 | 4/2002 | Rhodes |
| 6,734,031 B2 | 5/2004 | Shizukuishi |
| 6,852,591 B2 | 2/2005 | Rhodes |
| 6,947,088 B2 | 9/2005 | Kochi |
| 7,012,754 B2 | 3/2006 | Boettiger et al. |
| 7,068,432 B2 | 6/2006 | Boettiger et al. |

(Continued)

FOREIGN PATENT DOCUMENTS

JP        411186530        *  7/1999

OTHER PUBLICATIONS

G. Agranov, et al., IEEE Transactions on Electron Devices, ED-50, 2003 pp. 4-11.

*Primary Examiner*—Long Pham
(74) *Attorney, Agent, or Firm*—Dickstein Shapiro, LLP (57) ABSTRACT

A microlens array with reduced or no empty space between individual microlenses and a method for forming the same. The microlens array is formed by patterning a first set of microlens precursors in a checkerboard pattern on a substrate. The first set of microlens precursors is reflowed and cured into first microlenses impervious to subsequent reflows. Then, a second set of microlens precursors is patterned in spaces among the first microlenses, reflowed and cured into second microlenses. The reflows and cures can be conducted under different conditions, and the microlenses may be differently sized. The conditions of the reflows can be chosen to ensure that the focal lengths of microlenses are optimized for maximum sensor signal.

9 Claims, 12 Drawing Sheets

U.S. PATENT DOCUMENTS

2001/0052629 A1 12/2001 Assadi et al.
2003/0063204 A1 4/2003 Suda
2003/0063210 A1 4/2003 Tsuboi
2003/0210462 A1 11/2003 Freese et al.

* cited by examiner

GAPLESS MICROLENS ARRAY AND METHOD OF FABRICATION

CROSS REFERENCE TO RELATED APPLICATIONS

This application is a continuation in-part of application Ser. No. 10/681,308, filed Oct. 9, 2003 now U.S. Pat. No. 7,227,692, and application Ser. No. 11/002,231, filed on Dec. 3, 2004 now U.S. Pat. No. 7,307,788, which are hereby incorporated by reference.

FIELD OF THE INVENTION

The invention relates generally to imaging devices and, more particularly to an array of microlenses over an asymmetrical photosensor array used to focus light on said photosensor array, and the method of making said array.

BACKGROUND OF THE INVENTION

Imaging devices, including charge coupled devices (CCD) and complementary metal oxide semiconductor (CMOS) sensors have commonly been used in photo-imaging applications. A CMOS imager circuit includes a focal plane array of pixel cells, each one of the cells including a photosensor, for example, a photo gate, photo conductor or a photo diode for accumulating photo-generated charge in the specified portion of the substrate. Each pixel cell has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the functions of: (1) photon to charge conversion; (2) accumulation of image charge; (3) resetting the storage region to a known state; (4) transfer of charge to the storage region; (5) selection of a pixel for readout; and (6) output and amplification of signals representing pixel reset level and pixel charge. Photo charge may be amplified when it moves from the initial charge accumulation region to the storage region. The charge at the storage region is typically converted to a pixel output voltage by a source follower output transistor.

Exemplary CMOS imaging circuits, processing steps thereof, and detailed descriptions of the functions of various CMOS elements of an imaging circuit are described, for example, in U.S. Pat. No. 6,140,630; U.S. Pat. No. 6,376,868; U.S. Pat. No. 6,310,366; U.S. Pat. No. 6,326,652; U.S. Pat. No. 6,204,524; U.S. Pat. No. 6,333,205; and U.S. Pat. No. 6,852,591, all of which are assigned to Micron Technology, Inc. The disclosures of each of the foregoing are hereby incorporated by reference in their entirety.

The use of microlenses significantly improves the photosensitivity of the imaging device by collecting light from a large light collecting area and focusing it onto a small photosensitive area of the photosensor. As the size of imager arrays and photosensitive regions of pixels continue to decrease, it becomes increasingly difficult to provide a microlens capable of focusing incident light rays onto the photosensitive regions of the pixel cell. This problem is due in part to the increased difficulty in constructing a microlens that has the optimal focal characteristics for the increasingly smaller imager device. Microlens shaping during fabrication is important for optimizing the focal point of a microlens. This in turn increases the quantum efficiency for the underlying pixel array. Utilizing a spherical microlens shape is better for focusing incoming light onto a narrow focal point, which allows for the desired decrease in photosensor size. Spherical microlenses, however, suffer from gapping problems which are undesirable as described below.

Microlenses may be formed through an additive process. In conventional additive microlens fabrication, an intermediate lens material is deposited in an array onto a substrate and formed into a microlens array using a reflow process. Each microlens is formed with a minimum distance, typically no less than 0.3 microns, between adjacent microlenses. Any closer than 0.3 micrometers may cause two neighboring microlenses to bridge during reflow. In the known process, each microlens is patterned in a material layer as a single square with gaps around it. During reflow of the patterned square microlens material, a gel drop is formed in a partially spherical shape driven by the force equilibrium of surface tension and gravity. The microlenses then harden in this shape. If the gap between two adjacent gel drops is too narrow, they may touch and merge, or bridge, into one larger drop. Bridging changes the shape of the lenses, which leads to a change in focal length, or more precisely the energy distribution in the focal range. A change in the energy distribution in the focal range leads to a loss in quantum efficiency of, and enhanced cross-talk between, pixels. On the other hand, if the gapping is too wide during fabrication, the gaps allow unfocused photons through the empty spaces in the microlens array, leading to lower quantum efficiency and increased cross-talk between respective photosensors of adjacent pixel cells.

The proposal of using asymmetrical pixel cell architecture exacerbates the above-described problem of bridging. Due to the use of pixel cell arrays having asymmetrical architecture, the formation of microlenses through conventional processes leads to bridging and/or gapping, which results in lower quantum efficiency, as discussed above.

Accordingly, it is desirable to form a microlens arrays tailored to photosensor arrays having asymmetrical architecture. It is also desirable to form a microlens array having minimized gapping between the microlenses without causing bridging during the microlens fabrication reflow process.

BRIEF SUMMARY OF THE INVENTION

One exemplary embodiment of the invention relates to a microlens array with reduced or no empty space between individual microlenses and a method for forming the same. A further exemplary embodiment of the microlens array relates to microlenses that have a shifted focal point such that photon radiation is directed towards a photosensitive portion of asymmetrically formed photosensors.

BRIEF DESCRIPTION OF THE DRAWINGS

The above-described features and advantages of the invention will be more clearly understood from the following detailed description, which is provided with reference to the accompanying drawings in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

As used herein, the terms "semiconductor substrate" and "substrate" are to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductor structures. The semiconductor need not be silicon-based. The semiconductor could be other semiconductors including, for example, germanium or gallium arsenide. When reference is made to the semiconductor substrate in the following description, previous process steps may have been utilized to form regions or junctions in or over the base semiconductor or foundation.

The term "pixel cell," as used herein, refers to a photo-element unit cell containing a photosensor for converting photons to an electrical signal as may be employed by an imager device. Although the pixel cells are illustrated herein as CMOS four-transistor (or 4-T) pixel cells, it is not intended to be limiting in any way. For example, the pixel cells could have more or less than four transistors and the invention may be employed in any type of solid state imager.

The term "substantially gapless" is intended to cover not only microlens arrays having zero gaps between adjacent microlenses, but is also intended to more broadly encompass microlens arrays having substantially no gapping in areas between the microlenses. For example, a microlens array having approximately 3% or less of its surface area being space not covered by a microlens (i.e., approximately 3% or less gaps), is considered substantially gapless and is within the scope of the invention.

The term "asymmetrical" is to be understood as not symmetrical. For example, the term asymmetrical is intended to cover photosensors having different distances between each other. Additionally, the term asymmetrical is intended to cover microlenses having different shapes and/or sized from one another.

Figure 1:
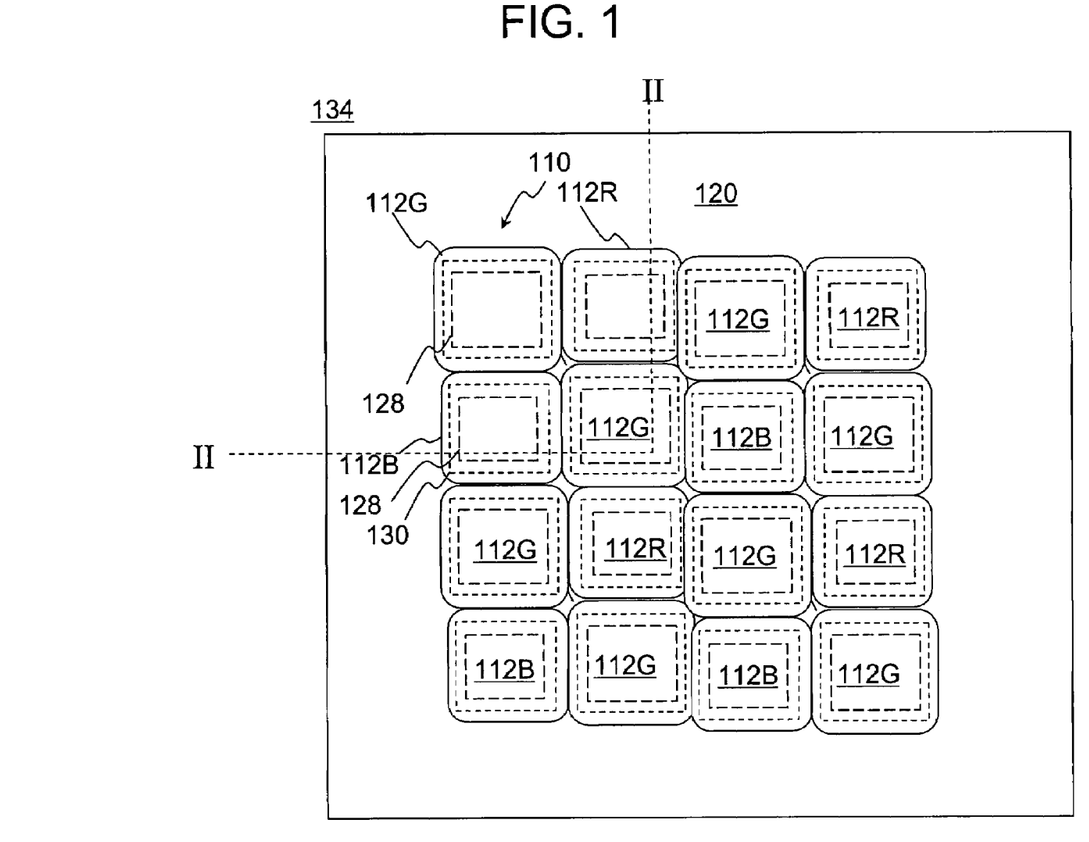
FIG. 1 illustrates a semiconductor-based imager constructed in accordance with an exemplary embodiment of the invention.

With reference to the figures, where like numerals represent like elements, FIG. 1 illustrates a top-down view of a portion of a semiconductor-based imager 134, such as a CMOS imager, constructed in accordance with an exemplary embodiment of the invention. The imager 134 includes an asymmetrical microlens array 110, with microlenses 112B, 112G, and 112R formed over a substrate 120. The substrate 120 has an array of pixel cells 130 having asymmetrically shaped photosensors 128. It should be noted that although the FIG. 1 imager 134 illustrates sixteen microlenses in the microlens array 110, the array 110 could contain millions of microlenses formed over millions of pixel cells 130.

Figure 2:
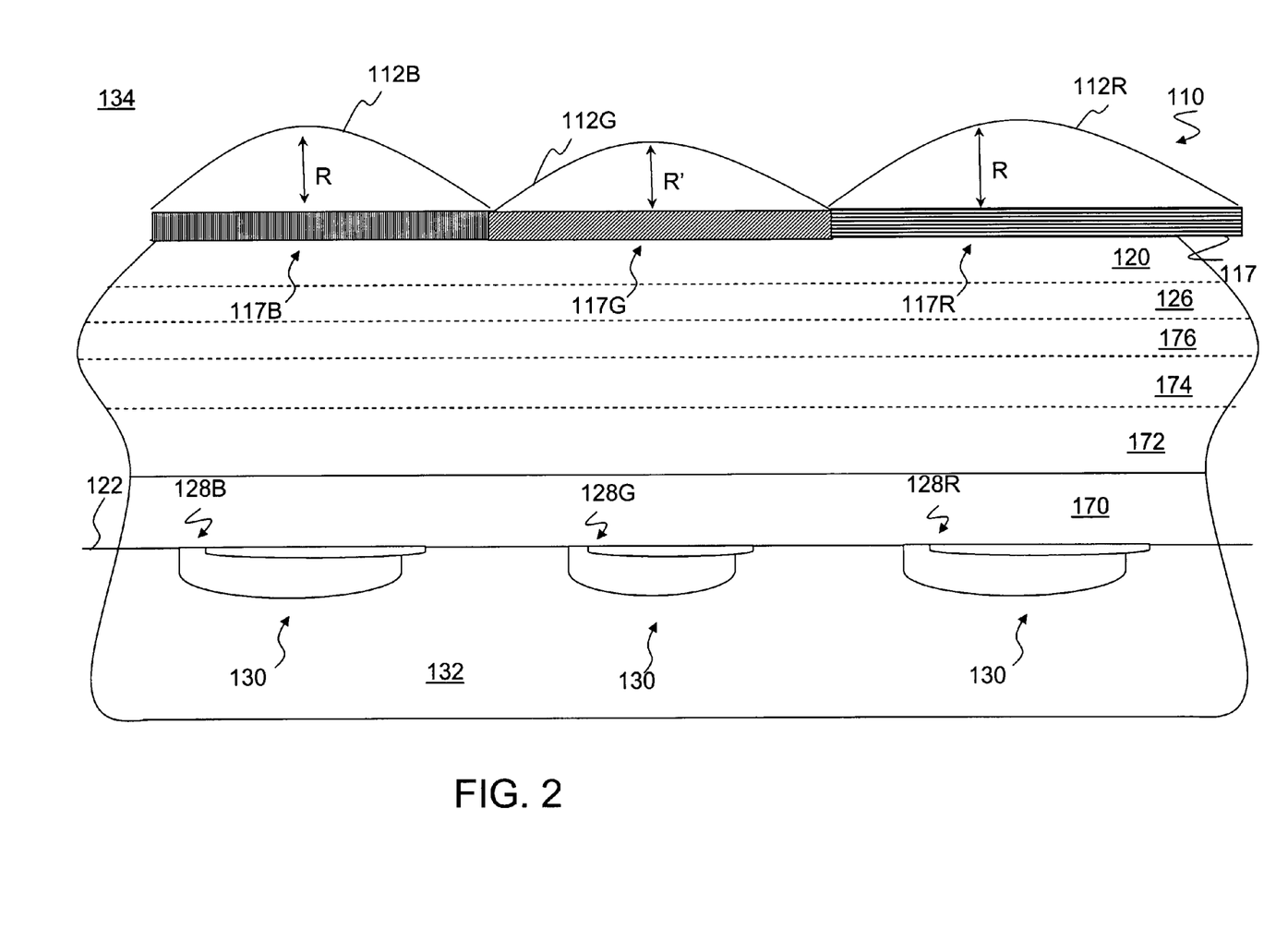
FIG. 2 illustrates a partial cross-sectional view taken along line II-II of FIG. 1.

FIG. 2 illustrates a cross-sectional view of the FIG. 1 microlens array 110 taken along the line II-II in FIG. 1. As illustrated, the imager 134 includes the asymmetrical microlens array 110, with microlenses 112B, 112G, and 112R formed over the substrate 120, which, in turn, is formed over a color filter array 117, having color filters 117B, 117G, 117R that allow only wavelengths of light corresponding to first, second, and third colors, respectively. For example, the first, second, and third colors could be blue, green, and red. The illustrated array 110 includes a first microlens 112B, a second microlens 112G, and a third microlens 112R, each formed on the substrate 120. The first microlenses 112B are formed for capturing wavelengths of light associated with a first color, e.g., blue, the second microlenses 112G are formed for capturing wavelengths of light associated with a second color, e.g., green, and the third microlenses 112R are formed for capturing wavelengths of light associated with a third color, e.g., red. Although the second microlens 112G is illustrated as having a smaller size (smaller radius (R')) and a smaller surface area than the first and second microlenses 112B, 112R, (having radii R) it is not intended to be limiting in any way. For example, the second microlenses 112G could have a surface area and size that is the same as or larger than the surface area and size of the first microlenses 112B.

The FIG. 2 imager 134 also includes a light shield 126 and pixel cells 130 associated with a wafer 132. Each pixel cell 130 includes a photosensor 128. As shown in FIG. 2, the microlenses 112G, 112B, and 112R are shaped and configured so that their focal lengths coincide with a focal plane 122, which runs through the photosensors 128. Alternatively, in a second exemplary embodiment of the invention, the microlenses 112B', 112G', and 112R' can be shaped and configured so that each of the first, second, and third microlenses 112B', 112G', and 112R' have focal lengths corresponding to different wavelengths of light, as illustrated in FIG. 3.

Figure 3:
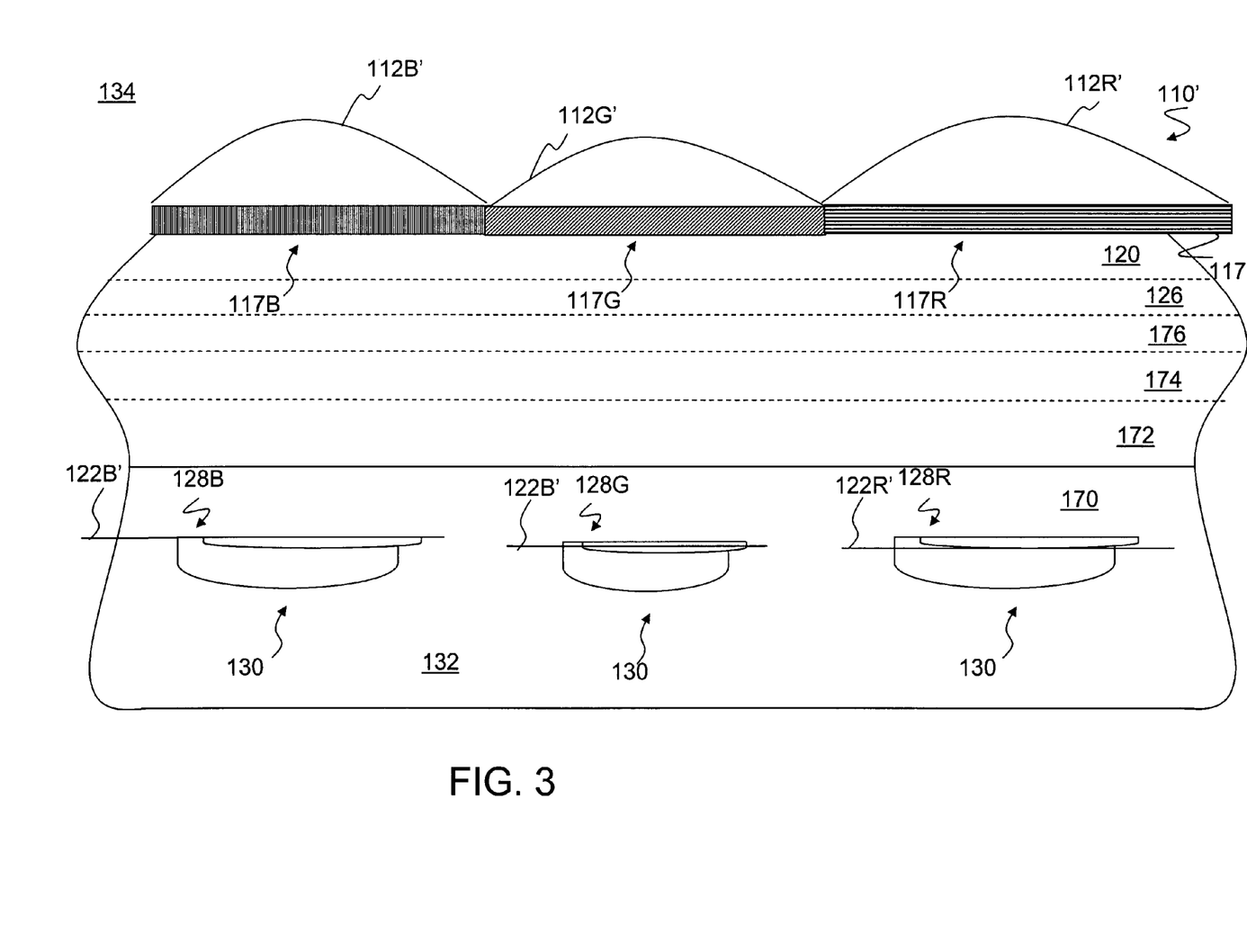
FIG. 3 illustrates a partial cross-sectional view of a second exemplary embodiment of the invention.

FIG. 3 illustrates focal lengths 122B', 122G', and 122R' that are tailored for each individual color pixel. As is known in the art, light at different wavelengths is absorbed at different depths within a photosensor; because microlenses 112B', 112G', and 112R' are formed to have focal lengths 122B', 122G', and 122R' optimized for the wavelength of light to be detected, e.g., green, blue, and red, respectively. For example, first microlens 112B' can be shaped to have a focal length 122B' corresponding to approximately a top surface of an underlying photosensor, third microlens 112R' can be formed having a focal length 122R' corresponding to a greater depth within an underlying photosensor, for example, approximately between 2 μm to 3 μm deep, and second microlens 112G' can be formed having a focal length 122G' corresponding to an intermediate depth within an underlying photosensor 128, between the focal length of microlenses 112B' and 112R'.

Other conventional layers typically employed in pixel cell arrays (e.g., pixel cell array 110, 110') are illustrated in FIGS. 2 and 3 as first, second, third, and fourth interlayer dielectric layers 170, 172, 174, 176.

As discussed above with respect to conventional microlens arrays, light transmitted directly through the substrate without going through a microlens is not properly focused relative to any pixel cells, and may increase the incidence of cross-talk between pixel cells. In contrast, the pixel arrays 110, 110' illustrated in FIGS. 1-3, have first, second, and third microlenses 112B, 112G, 112R, and 112B', 112G', 112R' that abut one another, thereby reducing the amount of space of the substrate 120 not covered by a microlens.

Figure 4:
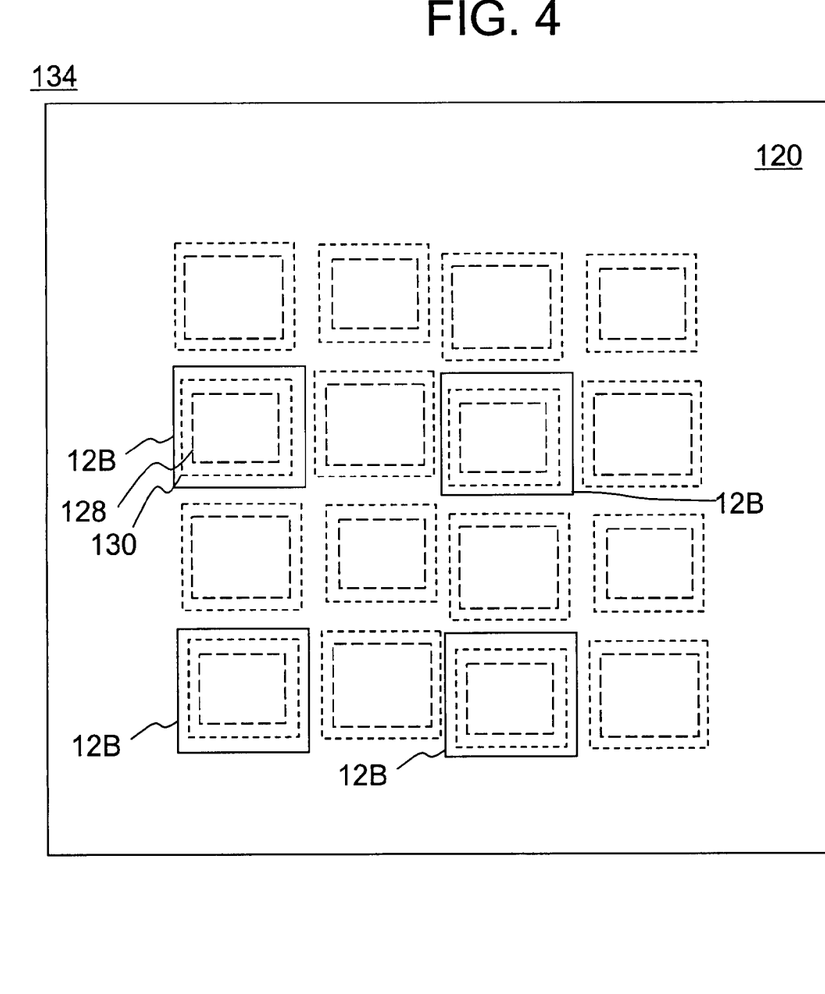
FIGS. 4-7 illustrate an exemplary method of fabricating the FIG. 1 imager.

FIGS. 4-7 illustrate a top-down view of an exemplary embodiment of fabricating the FIG. 1 imager 134. As illustrated in FIG. 4, a first microlens precursor 12B is deposited and patterned over a pixel cell array having corresponding pixel cells 130, e.g., a pixel cell 130 having a color filter corresponding to blue light formed between the first microlens 112B (FIG. 1) and the pixel cell 130. The substrate 120 could be formed of any suitable material which is transparent to photon radiation. Although each of the first microlens precursors 12B is illustrated as having a substantially rectangular configuration and each being substantially equal in size with the others, it is not intended to be limiting in any way. For example, each of the first microlens precursors 12B could be formed to have other shapes and be substantially different in size from one another.

Figure 5:
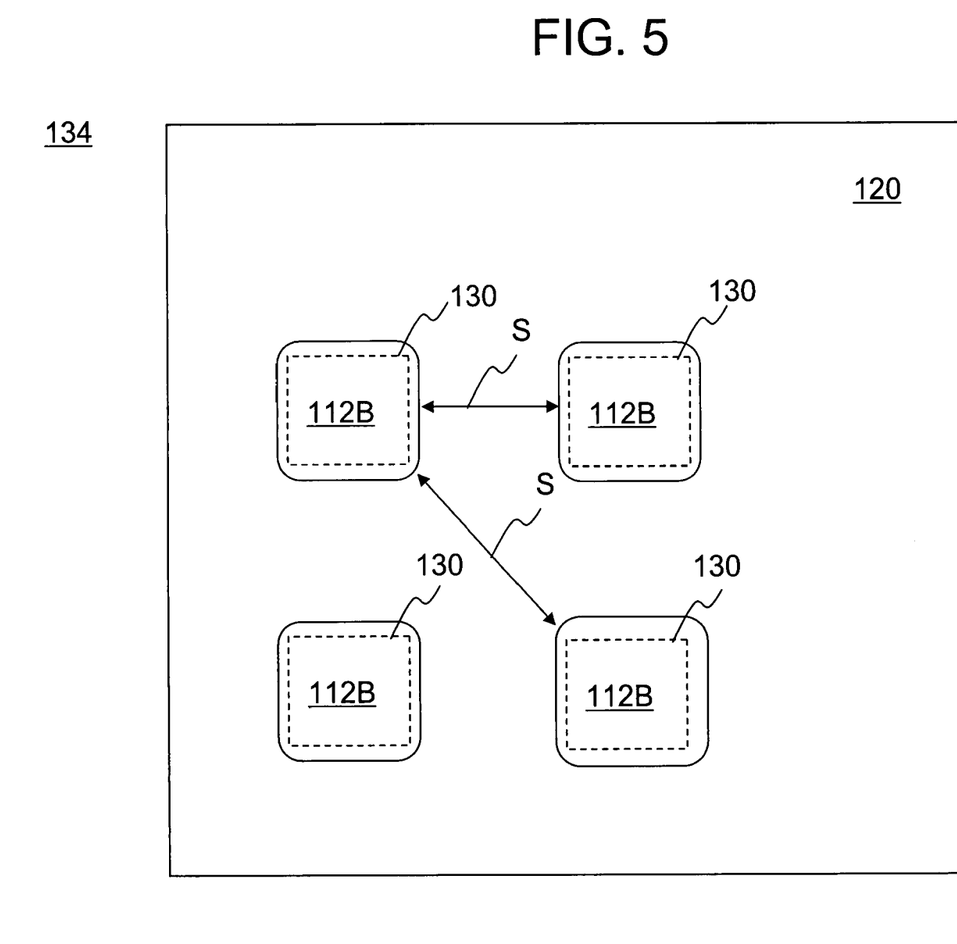

FIG. 5 illustrates first microlenses 112B formed from a material that that flows into a solidly cross-linked polymer, upon reflow, and that is impervious to subsequent reflow processes. During a reflow process conducted under reflow conditions, the substantially rectangular configuration of the first microlens precursor 12B (FIG. 4) is transformed into the first microlenses 112B, which has a somewhat rectangular configuration with rounded edges and a curved top. The first microlenses 112B, which are transparent to photon radiation, will retain their shape even if a subsequent reflow process is performed.

Figure 6:
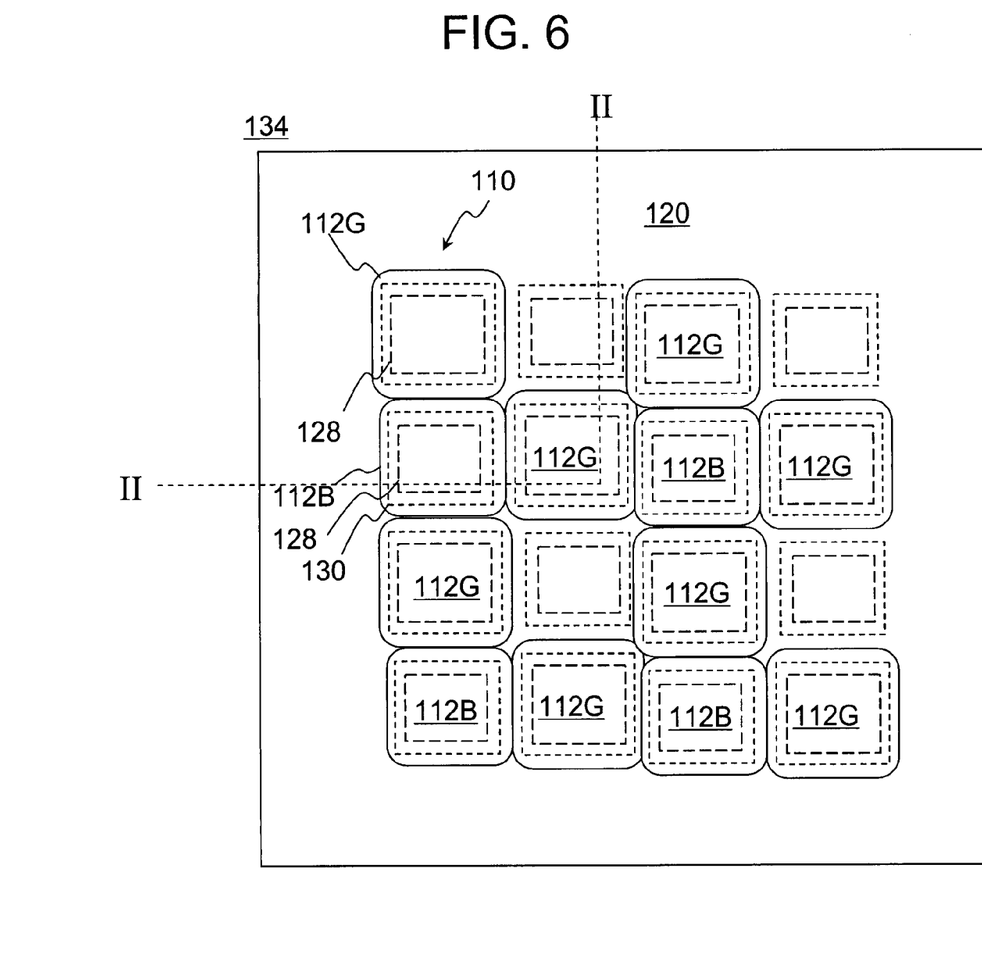

As shown in FIG. 5, there are spaces S between the first microlenses 112B. After patterning and reflowing the first microlens precursor 12B (FIG. 4) to form the first solidly cross-linked polymer microlenses 112B, second microlens precursors are patterned and reflowed on the substrate 120 to form the second microlenses 112G, as illustrated in FIG. 6. The second microlens precursors are patterned in a substantially rectangular configuration, and positioned in some of the spaces S between the first microlenses 112B. Additionally, portions of the second microlenses 112G can be formed overlapping the first microlenses 112B, as discussed further with respect to FIGS. 9A and 9B. As illustrated in FIG. 6, there are additional spaces S between the first and second microlenses 112B, 112G. It should be noted that the second reflow process may be conducted under different conditions than the first reflow process, if needed.

Figure 7:
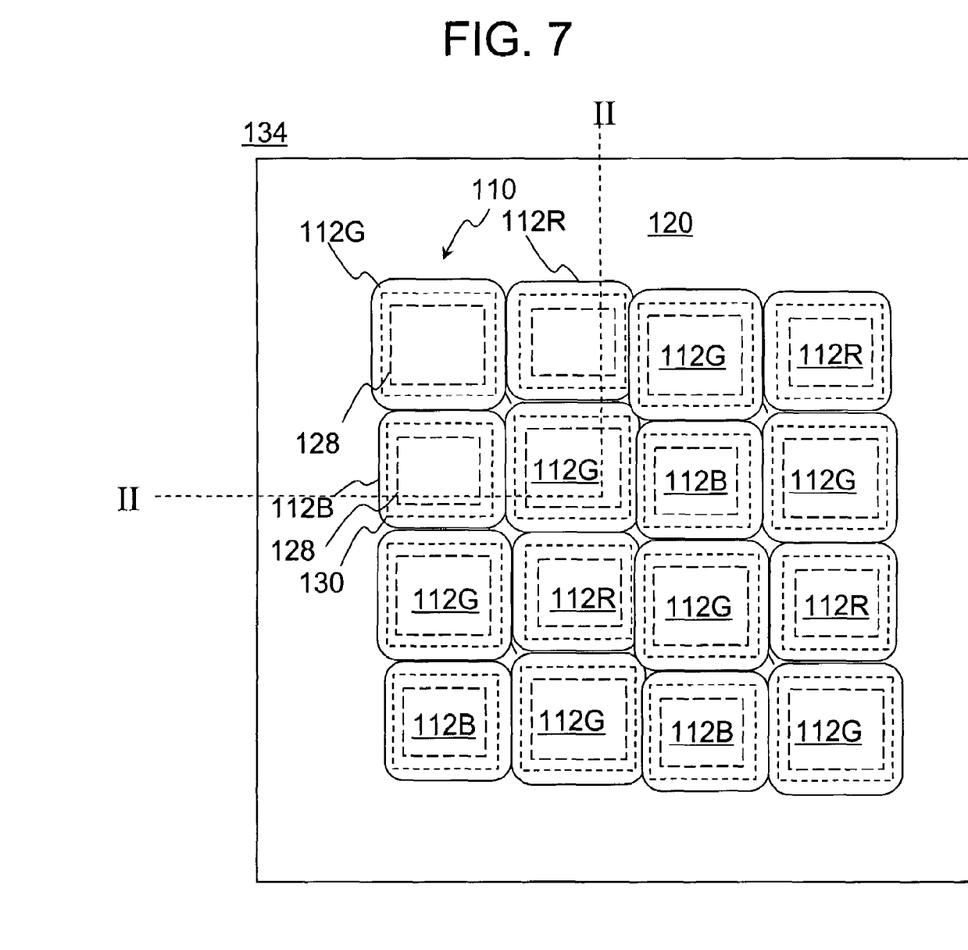

After patterning and reflowing the second microlens precursor to form the second solidly cross-linked polymer microlenses 112G, third microlens precursors are patterned and reflowed on the substrate 120 to form the third microlenses 112R as illustrated in FIG. 7. The third microlens precursors are patterned in a substantially rectangular configuration, and positioned in some of the spaces S between the first and second microlenses 112B, 112G. Additionally, portions of the third microlenses 112R can be formed overlapping the first and second microlenses 112B, 112G, as discussed further with respect to FIGS. 9A and 9B. It should be noted that the second reflow process may be conducted under different conditions than the first reflow process, if needed.

Although the second microlenses 112G are illustrated as being formed simultaneously, it is not intended to be limiting in any way. For example, the second microlenses 112G formed between two first microlenses 112B could be formed prior to second microlenses 112G formed between two third microlenses 112R. Similarly, the order of forming the first, second, and third microlenses 112B, 112G, 112R is not limited by the above-described exemplary embodiment; rather, the first, second, and third microlenses 112B, 112G, 112R can be formed in any order.

By forming the microlenses 112B, 112G, 112R through separate reflow processes, the microlens array 110 can be formed to accommodate asymmetrical photosensor architectures that have recently been proposed. Due to size limitations, many components of recently proposed pixel cells have been moved between photosensitive portions of the pixel cell, thereby creating asymmetrical pixel cells. Recently proposed pixel cell arrays have pixel cells with different sized photosensors (e.g., photosensors 128 of FIG. 4). Other recently proposed pixel cell arrays may have pixel cells having different shapes, as the miniaturization of the imager progresses. Conventional method of fabricating microlens arrays may lead to loss of quantum efficiency or bridging problems, as discussed above.

In addition, the microlens array 110 is formed in subsequent steps so that the microlens array 110 may provide greater signal strength for pixels that would conventionally exhibit a lower signal. For example, blue color pixels tend to produce an inherently lower output signal for a given light intensity. Thus, the microlens array 110 can be formed by creating larger microlenses, e.g., first microlenses 112B, for blue color pixels, which will collect more wavelengths of light and help balance pixel signal strength for the different color pixels of a pixel array. A balanced signal between colors assists the dynamic range of the photosensors in pixel cells because it avoids systematically sending pixels of one color into saturation while other pixels are only partially saturated.

An example of reflow conditions are described next. The shape of the microlenses after being subjected to reflow conditions is defined by several factors, including the thickness and type of material used to form the microlenses, the reflow temperature profile, and any pretreatment of the material that changes its glass transition temperature $T_g$. Examples of pretreatments include ultraviolet light exposure or preheating the material to a temperature below the glass transition temperature $T_g$. An example of first reflow conditions may include providing a plurality of first microlens precursors 12B (FIG. 4) at a first thickness and from a first type of material, exposing the first microlens precursors 12B (FIG. 4) with an ultraviolet light flood exposure of a specific dose, and reflowing at a first temperature ramp rate, followed by a cure. Second reflow conditions may include providing second microlens precursors of the first type of material at a second thickness and reflowing the second microlens precursors with the first temperature ramp rate, followed by a cure. Third reflow conditions may include providing a third microlens precursors of a third material type and of a third thickness, pre-heating the material to a temperature below the transition glass temperature $T_g$ of the third microlens precursors for a set period of time, and then reflowing at a second temperature ramp rate, followed by a cure.

Figure 8:
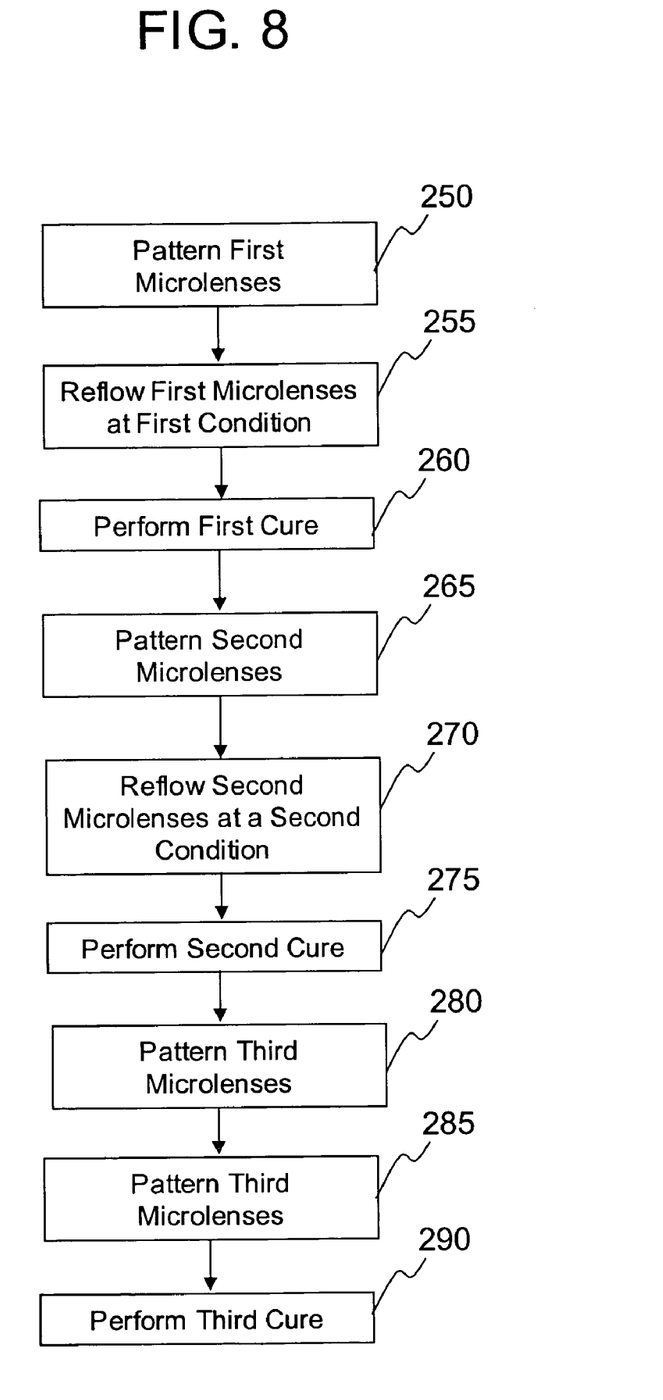
FIG. 8 is a flow diagram illustrating an exemplary method of fabricating the FIG. 1 imager.

FIG. 8 illustrates a flow diagram describing an exemplary process for forming the microlens array 110 (FIG. 7). At step 250, the first microlens precursor 12B (FIG. 4) is patterned on to the color filter array 117 (FIG. 2). The patterning, as described above with respect to FIG. 4, can be a checkerboard pattern, which includes spaces between portions of the first microlens precursor 12B (FIG. 4). A single reticle may be used to prepare each of the first microlens precursor 12B (FIG. 4) patterns. In the patterning step, a thin film of microlens material of a first thickness is coated on the substrate, the material is exposed using a suitable mask, and it is developed to either dissolve the exposed microlens material (positive resist) or dissolve the unexposed microlens material (negative resist). At step 255, the first microlens precursor 12B (FIG. 4) is reflowed. Reflowing of the first microlens precursor 12B (FIG. 4) turns the material into the first microlenses 112B (FIG. 5). At step 260, the first microlenses 112B (FIG. 5) are cured, thus forming a checkerboard pattern of solidly, cross-linked first microlenses 112B (FIG. 5).

At step 265, the second microlens precursors are patterned on to the color filter array 117 (FIG. 2) in some of the spaces between the first microlenses 112B (FIG. 5). A single reticle may be used to prepare each of the second microlens precursors depositions. If the second microlens precursors patterns are of the same size as the first microlens precursor 12B (FIG. 4), the same reticle used for the first microlens precursor 12B (FIG. 4) patterns may be used for the pattern of the second microlens precursors. To create the pattern of the second microlens precursors, the reticle is shifted.

At step 270, the second microlens precursors may be reflowed to form the second microlenses 112G (e.g., FIG. 6). The reflow conditions for the second microlens precursors may be different or the same as the reflow conditions for the first microlens precursors, depending on the application. For example, the reflow conditions for the second microlens precursors could entail varying the exposure and/or the dose of bleaching or the baking step temperature. By using different reflow conditions, the first microlenses 112B (e.g., FIG. 6) and second microlenses 112G (e.g., FIG. 6) can be formed having same or different focal lengths. At step 275, a second cure process is performed.

At step 280, third microlens precursors are patterned in remaining open spaces between the first and second microlenses 112B, 112G (e.g., FIG. 6). At step 285, the third microlens precursors may be reflowed at a reflow condition to form the third microlenses 112R (e.g., FIG. 6). The reflow conditions used to form the third microlenses 112R may be different or the same as the conditions used to form the first and second microlenses, for example, by varying the doses of exposing and/or bleaching or the baking step temperature. By using different reflow conditions, the third microlenses 112R (e.g., FIG. 6) can be formed such that their focal lengths are the same as or different from than the focal lengths of the first and second microlenses 112B, 112G, (e.g., FIG. 6). At step 290, a third cure process is performed.

The advantages of forming the first, second, and third microlenses 112B, 112G, 112R in separate steps include the potential to tailor each microlens to the specific color the microlenses are intended to transmit. For example, the radius, thickness, and materials used to fabricate each of the microlenses could be tailored for blue, green, and red (or cyan, magenta, and yellow). Another advantage includes the option to overlap microlenses when needed, as discussed further with respect to FIGS. 9A and 9B.

Figure 9A:
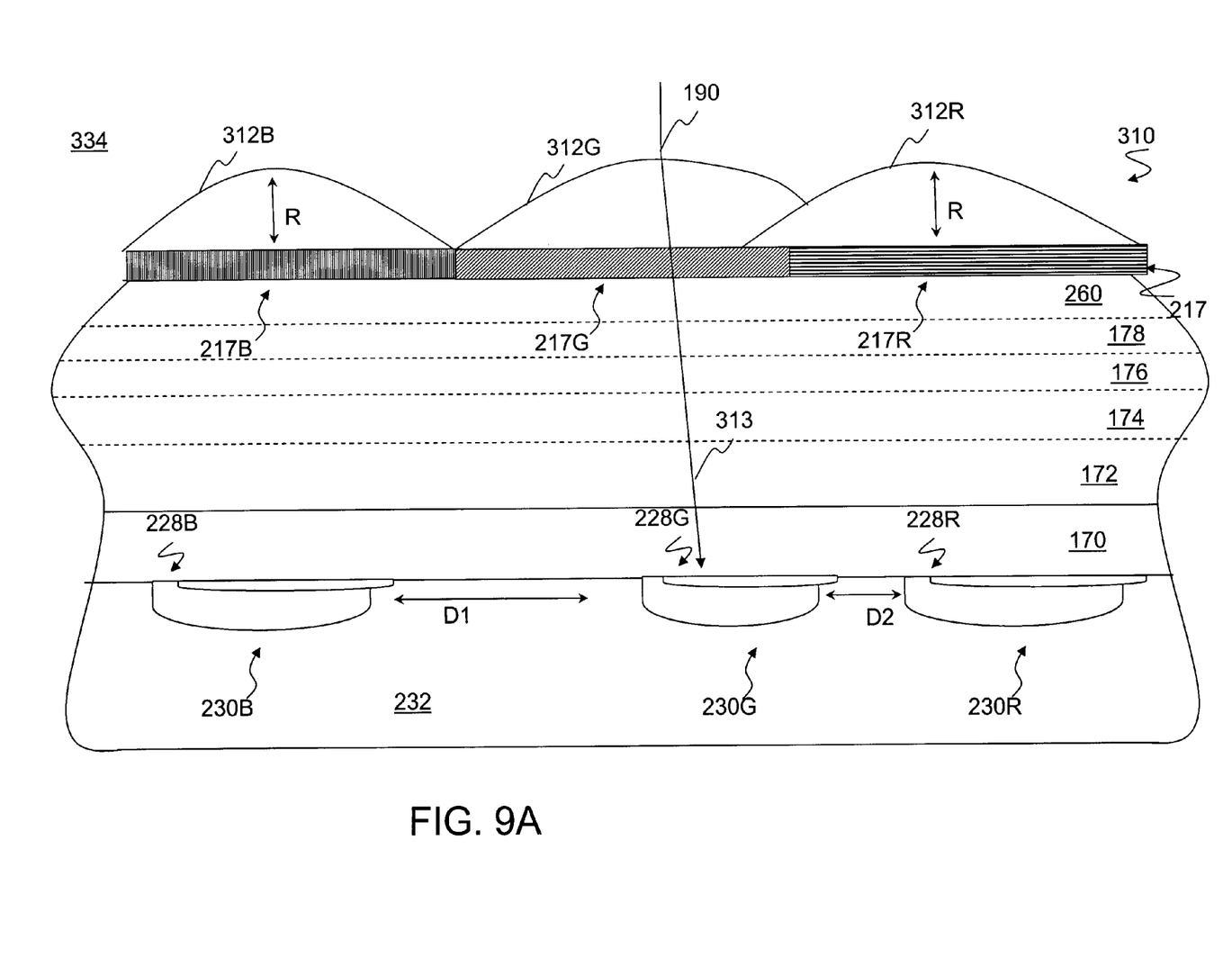
FIGS. 9A and 9B illustrate an imager constructed in accordance with a third exemplary embodiment of the invention.
Figure 9B:
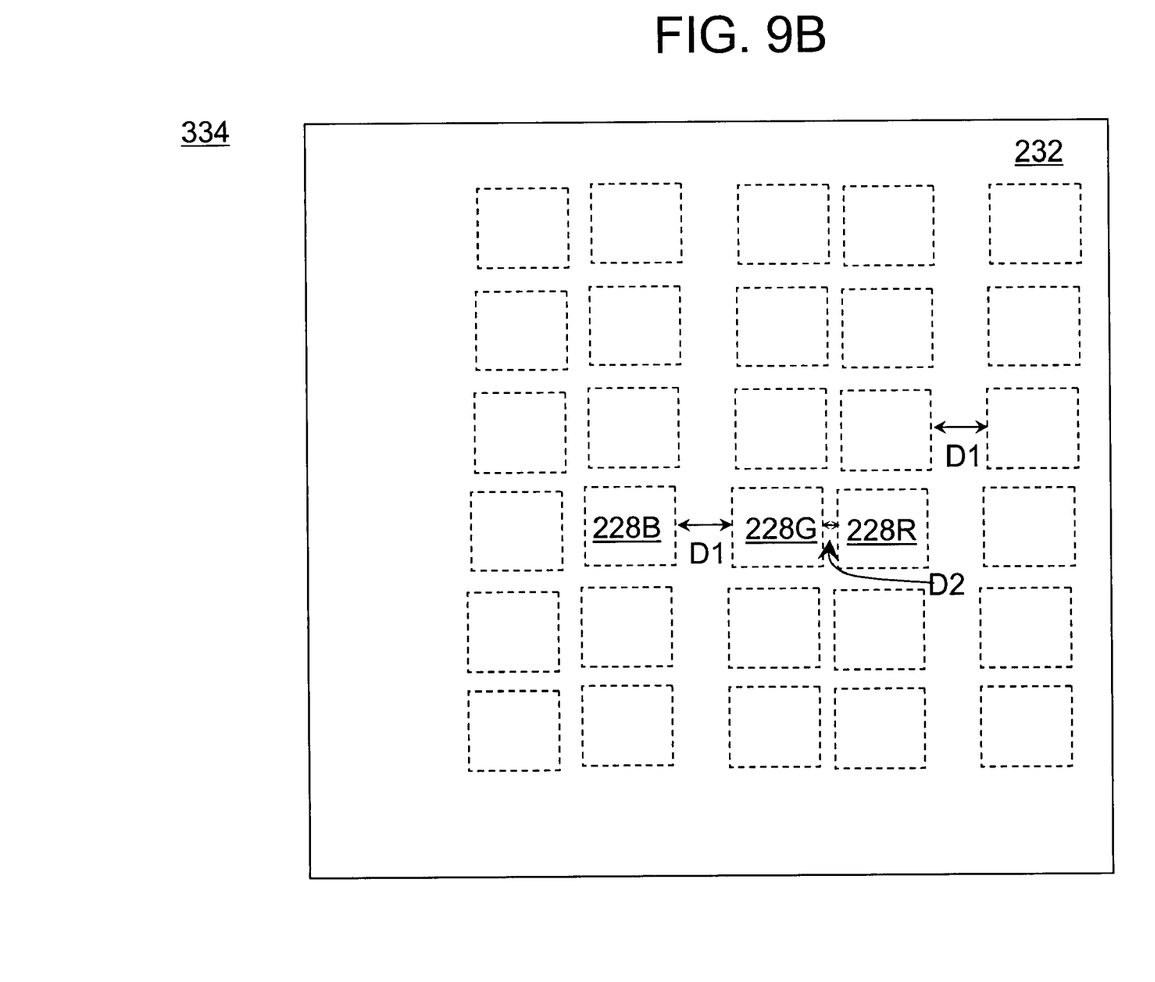

In a third exemplary embodiment of the invention, illustrated in FIGS. 9A and 9B, an imager 334 includes a microlens array 310 having overlapping first, second, and third microlenses 312B, 312G, 312R. By forming overlapping microlenses (e.g., second microlens 312G), the path that photon radiation 190 travels can be tailored to compensate for the asymmetry of the underlying photosensors 228. For example, as illustrated in FIGS. 9A and 9B, the distance between a blue photosensor 228B and a green photosensor 228G is a distance D1; whereas the distance between the green photosensor 228G and the red photosensor 228R is a distance D2. As illustrated, the distance D1 is greater than the distance D2, i.e., the distances are asymmetrical from each other.

The FIG. 9A imager 334 can be fabricated by a process similar to the process described above with respect to FIG. 8. For example, a first microlens precursor can be deposited and reflowed to form the first microlens 312B. In this example, however, the third microlens 312R is formed before the second microlens 312B, which is formed to overlap the first and second microlenses 312B, 312R, resulting in an asymmetrical path 313. It should be noted that the above-described process is only an exemplary method of forming the asymmetrical second microlens 312G, and that it is not intended to be limiting in any way. Additionally, any of the first, second, and third microlenses 312B, 312G, 312R could be formed as shifted, asymmetrical microlenses.

Although FIG. 9A illustrates the first and third microlenses 312B, 312R having a radius (R) substantially similar to one another, and different from the second microlens 312G, it is not intended to be limiting in any way. For example, the first, second, and third microlenses 312B, 312G, 312R could have substantially different radii from one another, each tailored to the specific color that each microlens is intended to transmit. Similarly the first, second, and third microlenses 312B, 312G, 312R could have substantially similar or substantially different thicknesses, each tailored to the specific color that each microlens is intended to transmit.

Figure 10:
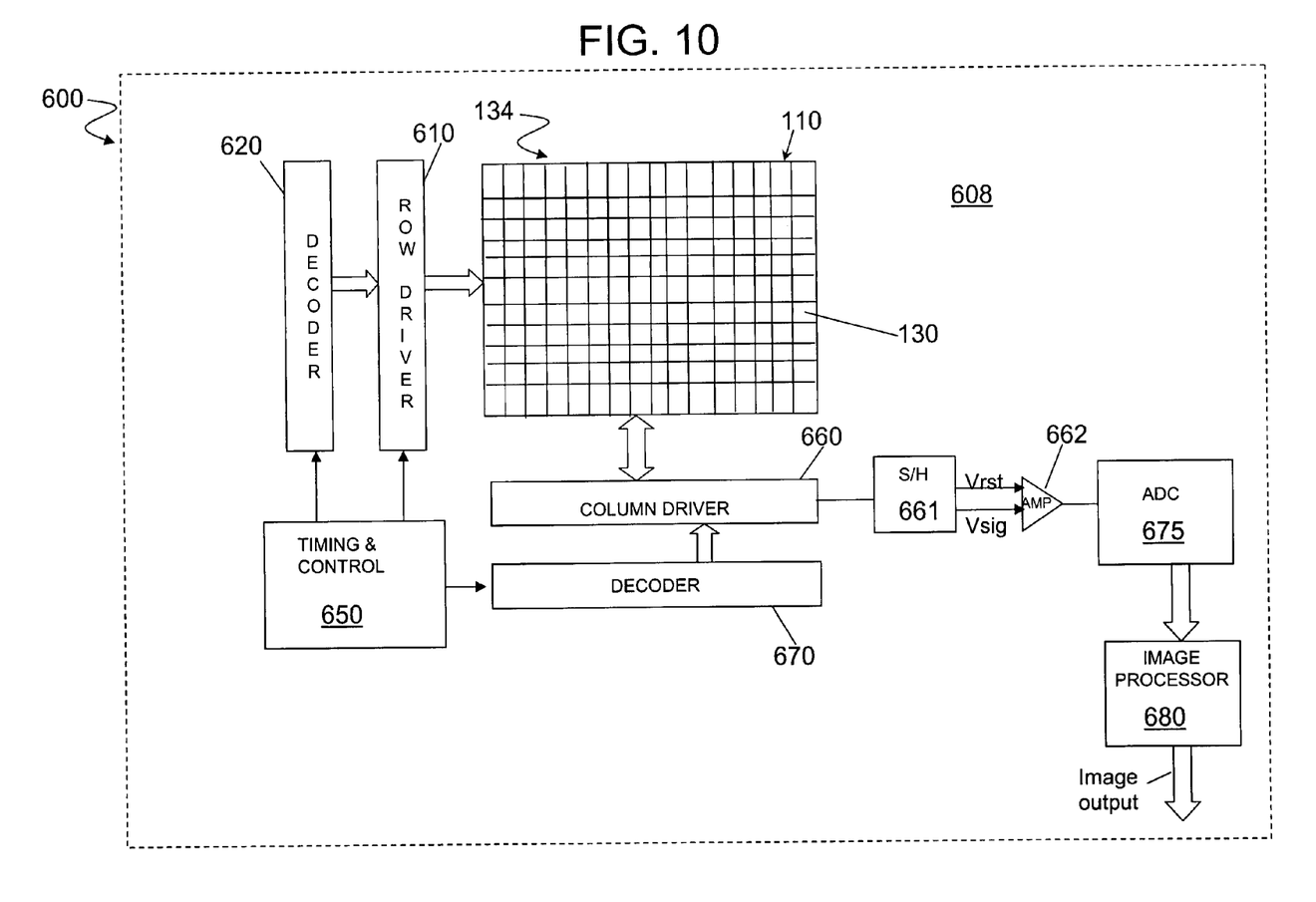
FIG. 10 is a block diagram of an imaging device incorporating the imager constructed in accordance with FIG. 1.

FIG. 10 illustrates an imaging device 608 incorporating an imager 134, 334 constructed in accordance with the invention. For the sake of clarity, the imaging device will be described as including the FIG. 1 imager 134; however, it should be noted that any of the exemplary embodiments described with respect to FIGS. 1-9B could be included.

In operation of the FIG. 10 imaging device 608, the pixel cells 130 of each row in the imager 134 are all turned on at the same time by a row select line, and the pixel cells 130 of each column are selectively output by respective column select lines. A plurality of row and column lines are provided for the entire array 110. The row lines are selectively activated in sequence by the row driver 610 in response to row address decoder 620 and the column select lines are selectively activated in sequence for each row activation by the column driver 660 in response to column address decoder 670. Thus, a row and column address is provided for each pixel cell 130. The imaging device 608 is operated by the control circuit 650, which controls address decoders 620, 670 for selecting the appropriate row and column lines for pixel readout, and row and column driver circuitry 610, 660, which apply driving voltage to the drive transistors of the selected row and column lines.

The pixel output signals typically include a pixel reset signal $V_{rst}$ taken off of the floating diffusion region (via the source follower transistor) when it is reset and a pixel image signal $V_{sig}$, which is taken off the floating diffusion region (via the source follower transistor) after charges generated by an image are transferred to it. The $V_{rst}$ and $V_{sig}$ signals are read by a sample and hold circuit 661 and are subtracted by a differential amplifier 662, which produces a difference signal ($V_{rst}$-$V_{sig}$) for each pixel cell 130, which represents the amount of light impinging on the pixel cell 130. This signal difference is digitized by an analog-to-digital converter (ADC) 675. The digitized pixel signals are then fed to an image processor 680 to form a digital image output. In addition, as depicted in FIG. 10, the imaging device 608 may be included on a single semiconductor chip (e.g., chip substrate 600).

Figure 11:
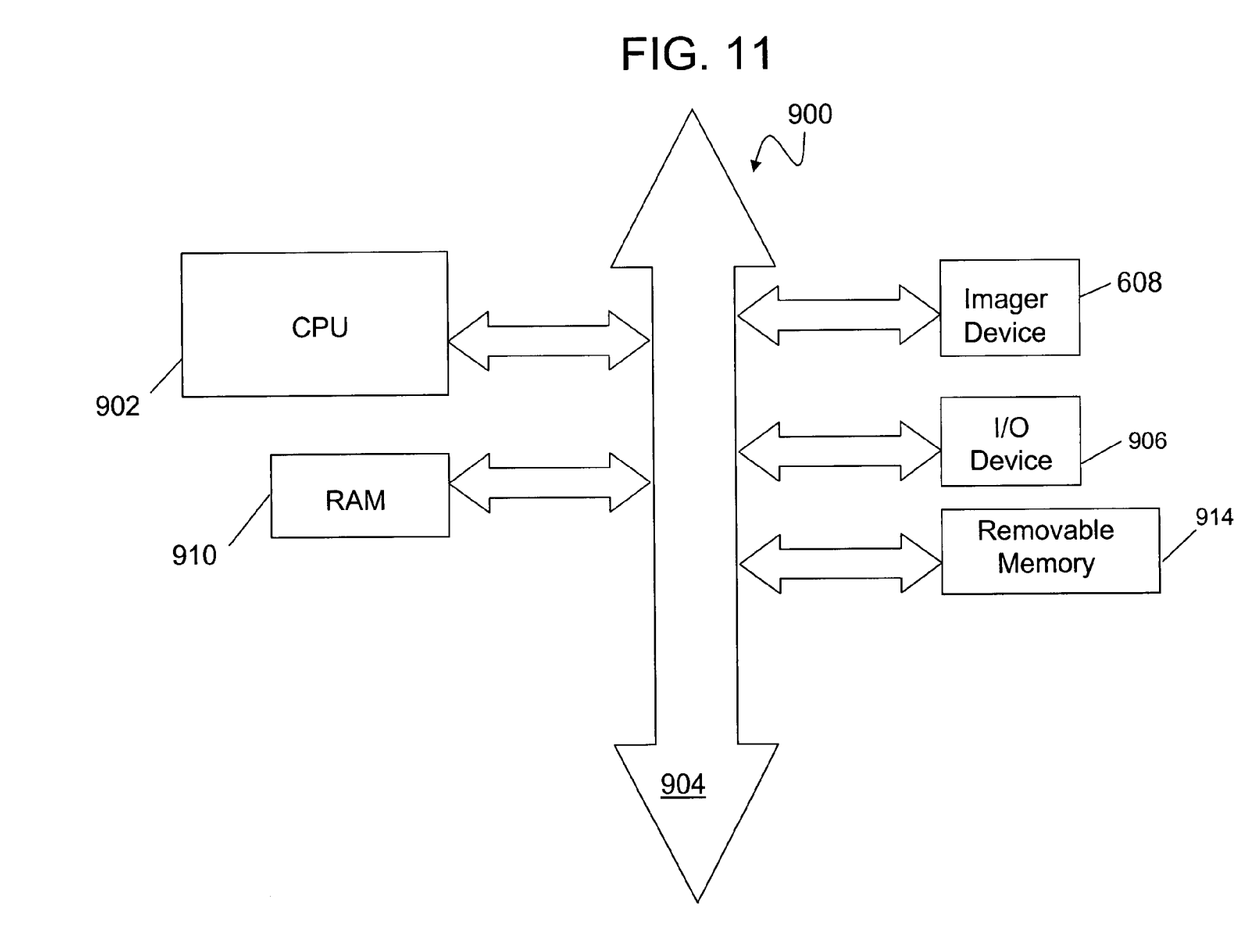
FIG. 11 is a schematic diagram of a processor system incorporating the FIG. 10 imaging device in accordance with an exemplary embodiment of the invention.

FIG. 11 shows a system 900, a typical processor system modified to include an imaging device (such as the FIG. 10 imaging device 608) of the invention. The processor system 900 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other systems employing an imager.

System 900, for example a camera system, generally comprises a central processing unit (CPU) 902, such as a microprocessor, that communicates with an input/output (I/O) device 906 over a bus 904. CMOS imager device 608 also communicates with the CPU 902 over the bus 904. The processor-based system 900 also includes random access memory (RAM) 910, and can include removable memory 914, such as flash memory, which also communicate with the CPU 902 over the bus 904. The imaging device 608 may be combined with a processor, such as a CPU, digital signal processor, or microprocessor, with or without memory storage on a single integrated circuit or on a different chip than the processor.

It should again be noted that although the invention has been described with specific references to CMOS imaging devices (e.g., 134, 234, 334, of FIGS. 1-9B), the invention has broader applicability and may be used in any imaging apparatus. For example, the invention may be used in conjunction with charge coupled device (CCD) imagers. The above description and drawings illustrate preferred embodiments which achieve the objects, features, and advantages of the invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A method of forming an imaging device, comprising:
providing a pixel cell array having at least one photosensor asymmetrically formed such that said at least one photosensor is spaced unequally from surrounding photosensors;
patterning a first set of microlens precursors onto a substrate formed over said pixel cell array;
reflowing the first set of microlens precursors under first reflow conditions;
curing the first set of microlens precursors to form first microlenses;
patterning a second set of microlens precursors onto the substrate;
reflowing the second set of microlens precursors; and
curing the second set of microlens precursors to form second microlenses,
wherein the second microlenses are each positioned in a space among the first microlenses and have a shifted focal point that coincides with a photosensitive region of said at least one asymmetrically formed photosensor.

2. The method of claim 1, wherein said reflowing the second set of microlens precursors comprises reflowing the second set of microlens precursors under reflow conditions that are different than said first reflow conditions.

3. The method of claim 2, wherein said first and second reflow conditions are chosen to create a focal length in said first microlenses substantially equal to a focal length in said second microlenses.

4. The method of claim 2, wherein said first and second reflow conditions are chosen to create a focal length in said first microlenses corresponding to a first wavelength of light and to create a focal length in said second microlenses corresponding to a second wavelength of light.

5. The method of claim 1, wherein said patterning the first set of microlens precursors comprises patterning the first set of microlens precursors into a first plurality of portions arranged in a checkerboard pattern, the checkerboard pattern including spaces between said portions.

6. The method of claim 5, wherein said patterning the second set of microlens precursors comprises patterning the second set of microlens precursors into a second plurality of portions in a complementary checkerboard pattern filling in said spaces between the plurality of portions of the first set of microlens precursors.

7. The method of claim 2, wherein said second plurality of portions comprise portions having a size no smaller than the size of the portions in the first plurality of patterns.

8. The method of claim 1, further comprising:
patterning a third set of microlens precursors onto the substrate;
reflowing the third set of microlens precursors; and
curing the third set of microlens precursors to form third microlenses.

9. The method of claim 8, wherein the patterning and reflow conditions of said first set, second set, and third set of microlens precursors create a microlens array having at least approximately no space between adjacent microlenses.

* * * * *